United States Patent [19]

Ueno et al.

[11] Patent Number: 5,767,697

[45] Date of Patent: Jun. 16, 1998

[54] LOW-VOLTAGE OUTPUT CIRCUIT FOR SEMICONDUCTOR DEVICE

[75] Inventors: Masaji Ueno, Sagamihara; Yasukazu Noine, Chigasaki, both of Japan

[73] Assignee: Kabushiki Kaisha Toshiba, Kawasaki, Japan

[21] Appl. No.: 584,487

[22] Filed: Jan. 11, 1996

[30] Foreign Application Priority Data

Jan. 14, 1995 [JP] Japan ................................. 7-021073

[51] Int. Cl.$^6$ .................... H03K 19/0175; H03K 19/094
[52] U.S. Cl. ................... 326/80; 326/81; 326/83; 326/27
[58] Field of Search ......................... 326/83, 80, 81, 326/27

[56] References Cited

FOREIGN PATENT DOCUMENTS

| 0 480 201 | 4/1992 | European Pat. Off. . |
|---|---|---|
| 0 498 377 | 8/1992 | European Pat. Off. . |

OTHER PUBLICATIONS

IBM Technical Disclosure Bulletin, vol. 34, No. 4B, pp. 147–149, Sep. 1, 1991, "Mixed Technology Overvoltage Protection".

*Primary Examiner*—Edward P. Westin
*Assistant Examiner*—Richard Roseen
*Attorney, Agent, or Firm*—Oblon, Spivak, McClelland, Maier & Neustadt, P.C.

[57] ABSTRACT

A low-voltage output circuit has the first and the second MOS transistors. An input signal is fed to the gate of the first transistor. Either of the source and the drain of the first transistor is supplied with a predetermined potential. The other is connected to an output terminal and generates an output signal. The first transistor raises the output signal to the predetermined potential level in response to the input signal. Either of the source and the drain of the second MOS transistor is connected to the gate of the first transistor. The other is connected to the output terminal. The circuit further includes a device for supplying a bias voltage to a gate of the second transistor so that the first and second transistors remain turned off at different gate bias potentials and the second transistor turns on before the first transistor when the output signal is raised to the predetermined potential level to keep the first transistor remaining turned off. The circuit further includes a device for restricting current flow from the output terminal to the predetermined potential side through the first and second transistors.

4 Claims, 6 Drawing Sheets

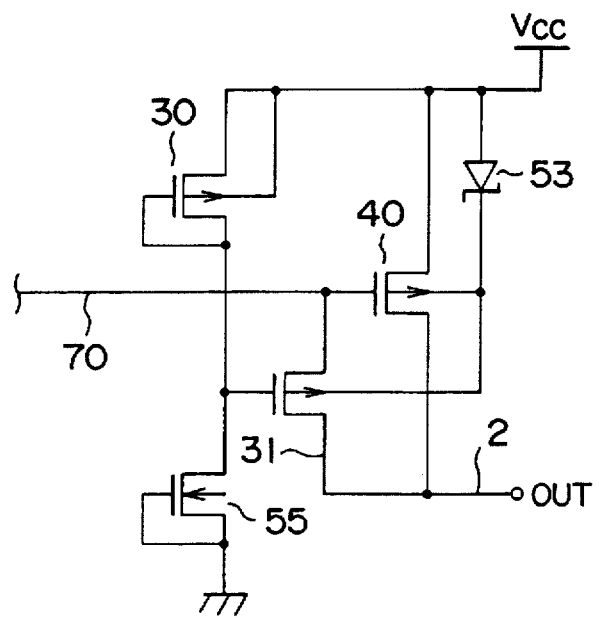
F I G. 6
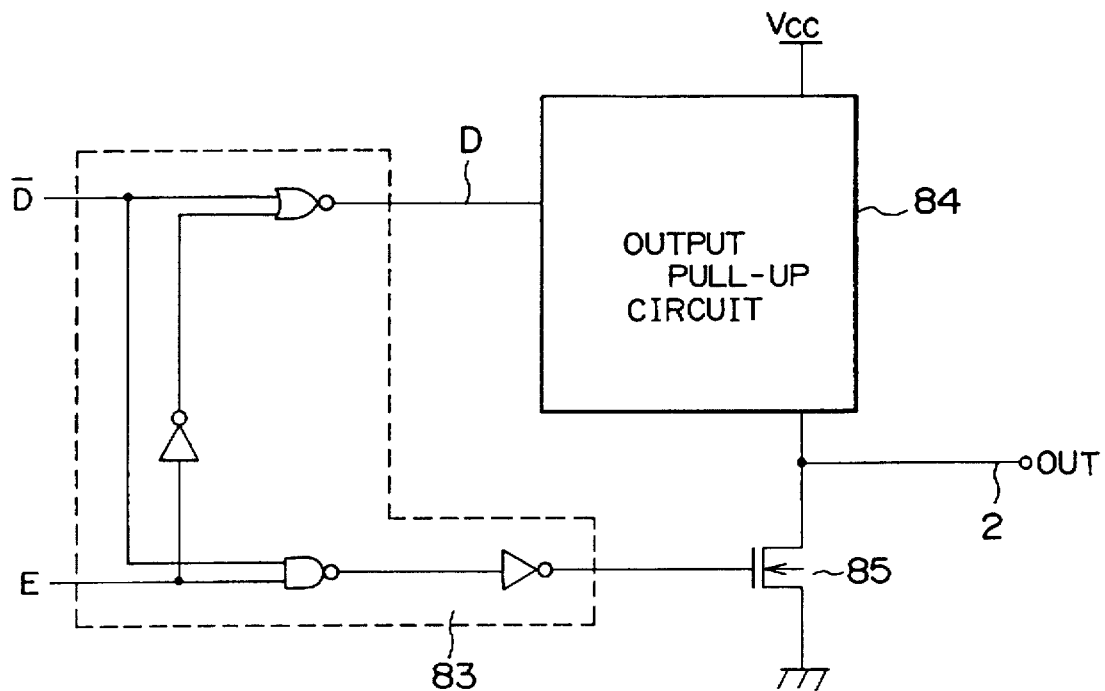
F I G. 7

LOW-VOLTAGE OUTPUT CIRCUIT FOR SEMICONDUCTOR DEVICE

BACKGROUND OF THE INVENTION

The present invention relates to a logic integrated circuit including CMOS or Bi-CMOS devices. Particularly, this invention relates to a low-voltage output circuit for a semiconductor device driven by different supply voltages.

Semiconductor devices, such as semiconductor integrated circuits have been developed with lower power supply and higher-speed signal transfer. One example of such device is a Bi-CMOS integrated circuit. This device is manufactured by bipolar and MOS technology.

The Bi-CMOS integrated circuit has mostly been supplied with 5 volts. However, with development of lower power supply technique, this circuit is now mostly supplied with 3 volts. Further, there is a semiconductor device having an integrated circuit with 5 volt-power supply and another integrated circuit with 3 volt-power supply.

Such a device with power supplies of different voltages has a disadvantage: a current sometimes flows from a higher- to a lower-power supply.

A low-voltage output circuit as shown in FIG. 1 is to prevent such current flow even when the output level of high impedance becomes higher than the power supply level. This circuit is disclosed in Japanese Patent Laid-Open NO. 5(1993)—259883.

In FIG. 1, an input signal is fed to the low-voltage output circuit via input terminal 1. An output signal is generated at an output terminal 2. The terminal 2 is connected to a bus interface (not shown) for combining the outputs signal with other signals of different voltages. The output circuit generates the output signal of specific current and voltages based on the input signal. For instance, when the supply voltage Vcc is 3.3 V, the output circuit generates the minimum output signal of −16 mA and 2.4 V or −40 mA and 2 V.

A transistor 58 is provided that functions as follows: the output terminal 2 is connected to the gate of the transistor 58 whenever the output voltage exceeds the threshold level of the transistor 58 and is greater than the supply voltage Vcc (sate voltage of the transistor 58). This results in the gate voltage of a transistor 48 becoming equal to its drain voltage (output voltage). And hence the gate voltage of the transistor 48 never exceeds its threshold voltage; and an output current does not flow to the power supply Vcc via transistor 48.

However, due to existence of the transistor 58, an output current flows from the drain of the transistor 48, via its source and schottky barrier diode (referred to as SBD hereinafter) 62, through a transistor 14.

This happens when the output voltage exceeds the threshold level of the transistor 48 and is greater than the supply voltage Vcc. However, since the substrate of the transistor 58 is connected to the cathode of SBD 54, an output current does not sink via drain and substrate of the transistor 58. More specifically, the output current does not flow to the power supply Vcc.

Further, a current restriction diode SBD 62 is provided. The diode 62 restricts a current that would flow into PN junction formed between the drain of the transistor 14 and its substrate connected to its source. The diode 62 functions so as to restrict an output current that would flow to the power supply Vcc when an external circuit (not shown) is connected to the output terminal 2 and driven by a supply voltage, such as 5.5 volts.

Since there is a voltage drop Vf across SBD 62, the output voltage of the inverter becomes Vcc−Vf at a node 70 (output terminal of the inverter.) The gate voltage of the transistor 48 also becomes Vcc−Vf.

When the output voltage is high due to an external high power supply, since the gate voltage of the transistor 48 is Vcc−Vf, the output voltage exceeds the threshold level of the transistor 48 before exceeding the threshold level of the transistor 58. The output current thus continues to sink until the output voltage increases enough to exceed the threshold level of the transistor 58. The gate voltage of the transistor 48 is thus cramped at the output voltage.

The low-voltage output circuit is further provided with a PMOS transistor 64, a bias diode SBD 68, and a bias resistor 68. Output current sinking via transistor 64 is restricted by SBDs 54 and 62.

Before the transistor 48 sinks, the gate voltage of the transistor 48 is surely cramped at the output voltage. The transistor 64 functions so as to cramp the gate voltage of the transistor 48 so that the output current does not sink via transistor 48 when the output voltage becomes greater than the gate of the transistor 64 and exceeds its threshold level. The gate voltage of the transistor 48 is cramped at the output voltage before the transistor 48 sinks because the gate of the transistor 64 is fed with the supply voltage Vcc via SBD 66.

As described above, there is provided a BiCMOS bus interface low-voltage output circuit that connects a semiconductor device with low voltage supply to other devices including a device driven by a supply voltage, such as 5 volts.

In this circuit, a gate bias voltage of the output pull-up transistor 48 when it is off can be set at any level that is very close to the gate bias voltages of the cramp transistors 64 and 58. This circuit is thus easy to design and control.

However, since gate bias voltage setting is done by the transistor 68, the power supply Vcc always feeds a d.c. current to the resistor 68 via SBD 66. And the resistor 68 must be of high resistance, such as 50 kΩ, in order to lower gate bias voltage setting and power supply. However, this requires a larger pattern area. There is thus trade-off relationship between the gate bias voltage setting and power supply, and the pattern area. This cannot meet the demands for more miniaturized and lower-powered IC and LSI devices.

Further, a reverse current 56 flows as shown in FIG. 2 when the gate bias voltage of the transistor 64 is higher than that of the output transistor 48 when it is off. FIG. 2 depicts the characteristics of the circuit of FIG. 1. The vertical axes indicate the voltage applied to the transistor 48 and the reverse current. The horizontal axis indicates output signal level.

The threshold level of the transistor 48 depends on the resistor (R) 68. More in detail, the larger the resistor 68, the more the reverse current increases. On the contrary, a smaller resistor 68 will not work.

An output pull-up transistor usually becomes large to generate a large current when the gate bias voltages of the transistors 48 and 64 are equal to each other. Suppose that the transistor 64 producing a current of, such as 0.1 μA, cannot short-circuit the transistor 48 during the process in which the transistor 64 turns on to short-circuit the gate of the transistor 48 and the output terminal 2.

This means that a reverse current of 0.1 μA multiplied by the size of the transistor 48 flows therethrough. Size ratio is usually in the range of 100 to 200, a reverse current of several ten μA will flow.

It is concluded that the transistor 64 for preventing reverse current flow requires a gate-source voltage Vgs (64) when it is turned off, larger than a gate-source voltage Vgs (48) of the transistor 48 when it is also turned off. Therefore, when Vth (Von) denotes the threshold level of the output transistor 48, the following relation must be established.

|Vth (Von)|>Vgs (64)>Vgs (48)

The threshold level is usually in the range of |0.7| to |0.8| V, the gate-source voltage Vgs (48) becomes equal to the voltage drop Vf of SBD 62. And hence the gate-source voltage Vgs (64) becomes a value in the middle of the maximum and minimum of the above relationship.

However, it is very difficult to meet the above relationship with the consideration of variation of resistance and threshold level, and temperature-characteristics. Therefore, very accurate process control is required for the circuit of FIG. 1 to completely prevent reverse current flow.

SUMMARY OF THE INVENTION

An object of the present invention is to provide a low-voltage output circuit of the small number of elements without consideration of the maximum voltage of threshold level range and accurate process control used for a semiconductor device driven by different supply voltages.

According to the present invention, there is provided a low-voltage output circuit, comprising: a first metal-oxide-semiconductor (MOS) transistor having a gate supplied with an input signal, and a source and a drain, either of the source and drain being supplied with a predetermined potential, the other being connected to an output terminal and generating an output signal, the first transistor rasing the output signal to the predetermined potential level in response to the input terminal; a second MOS transistor having a source and a drain, either of the source and drain being connected to the gate of the first transistor, the other being connected to the output terminal; means for supplying a bias voltage to a gate of the second transistor so that the first and second transistors remain turned off at different gate bias potentials and the second transistor turns on before the first transistor when the output signal is raised to the predetermined potential level to keep the first transistor remaining turned off; and means for restricting current flow from the output terminal to the predetermined potential side through the first and second transistors.

The supplying means may include a third MOS transistor having a gate, a source, and a drain, either of the source and drain being supplied with the predetermined potential, the other connected to the gates of the second and third transistors, the third transistor supplying the bias voltage to the gate of the second transistor so that the bias voltage corresponds to a difference between the predetermined potential and a threshold level of the third transistor.

Further, the supplying means may include a schottky barrier diode having an anode and a cathode, either of the anode and cathode being connected to the gate of the second transistor, the other being supplied with a reference potential.

The supplying means may further include a fourth MOS transistor, a conductive type of the fourth transistor being opposite to types of the first, second, and third transistors, the fourth MOS transistor having a source and a drain, either of the source and drain being connected to the gate of the second transistor, the other being connected to a gate of the fourth transistor and being supplied with a reference potential.

The second and third transistors may be formed in the same size and layout, and close to each other on a semiconductor substrate.

The restricting means may include a schottky barrier diode having an anode and a cathode, either of the anode and cathode being supplied with the predetermined potential, the other being connected to substrates of the first and second transistors. The other of the anode and cathode of the schottky barrier diode may further be connected to a substrate of the third transistor.

BRIEF DESCRIPTION OF THE DRAWINGS

FIG. 6 is a circuit diagram of the fourth preferred embodiment of the low-voltage output circuit according to the present invention;

FIG. 7 is a circuit diagram of the fifth preferred embodiment of the low-voltage output circuit according to the present invention;

DETAILED DESCRIPTION OF THE PREFERRED EMBODIMENTS

Preferred embodiments according to the present invention will be described with reference to the attached drawings.

Figure 3:
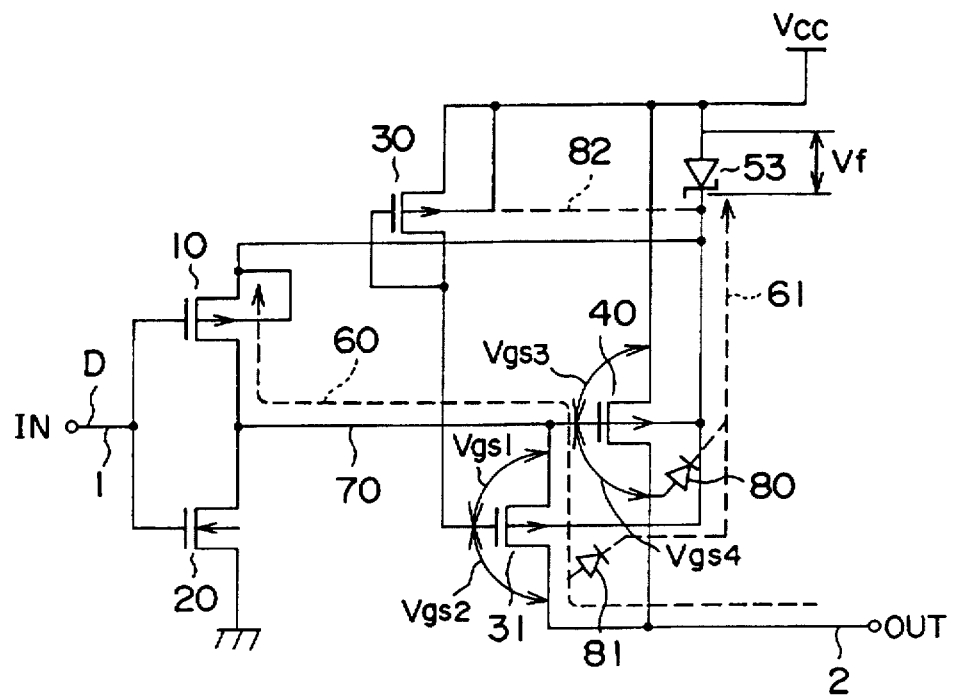
FIG. 3 is a circuit diagram of the first (and second) preferred embodiment of the low-voltage output circuit according to the present invention.

FIG. 3 shows the first preferred embodiment of the low-voltage output circuit according to the present invention.

In FIG. 3, an input signal is fed to the low-voltage output circuit via input terminal 1. An output signal is generated at an output terminal 2. The terminal 2 is connected to a bus interface (not shown) for combining the output signal with signals of different voltages from other devices (not shown). A logic signal of "1" or "0" is fed as the input signal to an output pull-up PMOS transistor 40. The transistor 40 turns on or off by the logic signal.

More specifically, the input signal is first fed to an inverter that consists of a PMOS transistor 10 and an NMOS transistor 20. The input terminal 1 is connected to the gates of both transistors. The drains of both transistors are connected to each other. The source of the transistor 20 is grounded. The output of the inverter is fed to the gate of the transistor 40. The source of the transistor 40 is connected to a power supply Vcc (sometimes referred to as a supply voltage Vcc). Its drain is connected to the output terminal 2.

A schottky barrier diode (referred to as SBD hereinafter) 53 is connected between the substrate of the transistor 40 and the power supply Vcc. The diode SBD 53 restricts current flow through the substrate from the output terminal 2.

The cathode of SBD 53 is further connected to the source of the transistor 10. The diode SBD 53 restricts a current that would flow into PN junction formed between the drain of the transistor 10 and its substrate connected to its source. The diode SBD 53 functions so as to restrict an output current that would flow to the power supply Vcc when an external circuit (not shown) is connected to the output terminal 2 and driven by a supply voltage, such as 5.5 volts.

The low-voltage output circuit is further provided with a PMOS transistor 31 for restricting reverse current flow and a PMOS transistor 30 for driving the transistor 31. The drain, source, and gate of the transistor 31 are connected to the output terminal 2, the gate of the transistor 40, and the drain of the transistor 30, respectively. Further, the substrate of the transistor 31 is connected to cathode of SBD 53. The gate and drain of the transistor 30 are connected to each other. The source and substrate of the transistor 30 are connected to the power supply Vcc.

The transistor 31 functions as follows: the output terminal 2 is connected to the gate of the transistor 40 whenever the output voltage becomes greater than the gate voltage of the transistor 31 (the difference between the supply voltage Vcc and the threshold level of the transistor 30) and exceeds the threshold level of the transistor 31. This results in the gate voltage of the transistor 40 becoming equal to its drain voltage (output voltage). And hence the gate voltage of the transistor 40 never exceeds its threshold level; and an output current does not flow to the power supply Vcc via transistor 40.

However, due to existence of the transistor 31, an output current flows from the drain of the transistor 40, via its source and SBD 53, through the transistor 10. This happens when the output voltage exceeds the threshold level of the transistor 40 and is greater than the supply voltage Vcc.

However, since the substrate of the transistor 31 is connected to the cathode of SBD 53, a current 61 does not sink via drain and substrate of the transistor 31. More specifically, the current 61 does not flow to the power supply Vcc. Further, the diode SBD 53 prevents current flow 60 via drain and source of the transistor 31.

Before the transistor 40 sinks, the gate voltage of the transistor 40 is surely cramped at the output voltage. The transistor 31 functions so as to cramp the gate voltage of the transistor 40 so that the output current does not sink via transistor 40 when the output voltage becomes greater than the gate voltage of the transistor 31 and exceeds its threshold level. The transistor 31 cramps the output voltage before the transistor 40 sinks because the gate of the transistor 31 is connected to the power supply Vcc via transistor 30.

As described above, there is provided low-voltage output circuit that connects a semiconductor device with low voltage supply, via interface, to other devices including a device driven by a high supply voltage, such as 5 volts.

The transistor 30 supplies a bias voltage Vgs2 [Vcc−Vth(30)] to the gate of the transistor 31. Here, Vth(30) denotes the gate bias voltage of the transistor 30. The transistor 20 turns on when a logic signal "1" is fed to the input terminal 1 (node D). A node 70 is thus grounded to turn on the transistor 40. The output is raised to the Vcc level when it is not terminated. In this case, the output terminal 2 and the gate of the transistor 31 function as a source. There is a usual threshold level between the output terminal 2 and the gate of the transistor 31. However, since the substrate of the transistor 31 is supplied with the voltage [Vcc−Vf(53)], the threshold level Vth(31) of the transistor 31 is raised by several 10 mV. Here, Vf(53) denotes the voltage drop across SBD 53. Thus, the transistor 31 does not turn on.

The following relationship is thus established:

$$Vgs2 = [Vcc - Vth(30)] \leq Vth(31) \quad (1)$$

where, Vgs2 denotes the gate bias voltage of the transistor 31.

In contrast to this, the transistor 10 turns on when a logic signal "0" is fed to the input terminal 1 (node D). A voltage corresponding to [Vcc−Vf(53)] appears at the node 70 to turn off the transistor 40. Because the gate bias voltage Vgs4 of the transistor 40 is lower than its threshold level Vth(40).

Further, the transistor 31 remains turned off because its threshold level Vth(31) is expressed as flows:

$$[Vcc - Vf(53)] - [Vcc - Vth(30)] < Vth(31) \quad (2)$$

The low-voltage output circuit shown in FIG. 3 is further described with reference to FIG. 4. The description is made where the logic signal "0" is fed to the input terminal 1 (node D) and a voltage is applied to the output terminal 2 from the ground level to the supply voltage Vcc level or more.

Figure 4:
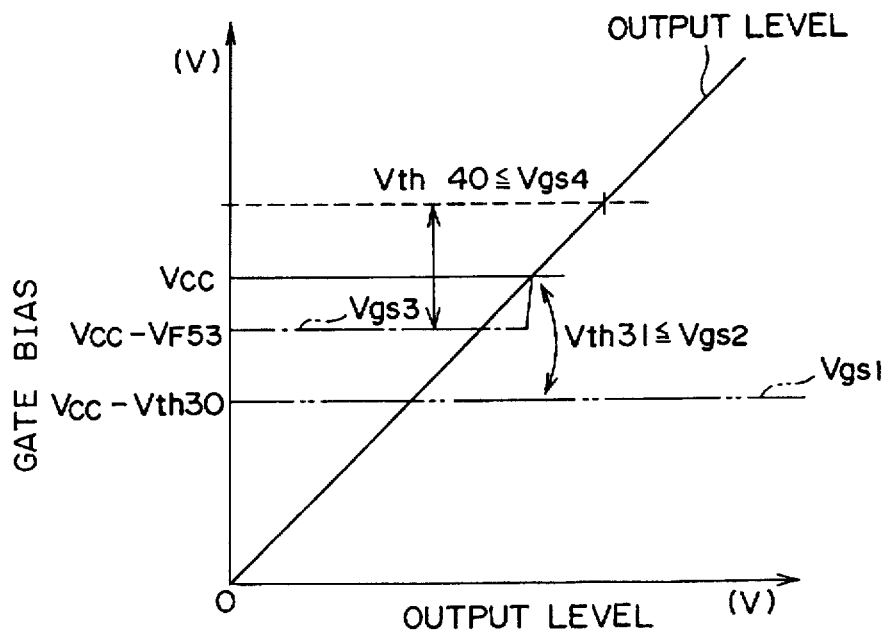
FIG. 4 is a graph representing the output characteristics of the circuit shown in FIG. 3.

FIG. 4 represents the output characteristics of the circuit of FIG. 3 where the output level (at terminal 2) is varied.

As shown in FIG. 4, the source of the transistor 31 is the same level as the node 70 when the output level is low enough. Since the source of the transistor 40 is supplied with the supply voltage Vcc, the gate bias voltages Vgs1 and Vgs3 of the transistors 31 and 40, respectively, are expressed as follows:

$$Vgs1 = [Vcc - Vf(53)] - [Vcc - Vth(30)] < Vth(31) \quad (3)$$

$$Vgs3 = Vcc - [Vcc - Vth(53)] < Vth(40) \quad (4)$$

Thus, the transistors 31 and 40 are off. Here, Vth(40) denotes the threshold level of the transistor 40.

Next, the output level is raised. the output terminal 2 that functions as a drain when the output level is low enough, in this case, functions as a source for the transistors 31 and 40. And the gate bias voltages of the transistors 31 and 40 are Vgs2 and Vgs4, respectively. The bias voltage Vgs4 is higher than the voltage Vgs2 and its difference is in the range of 0.5 to 0.7 volts. The transistor 31 thus turns on before the transistor 40 when the basis voltages Vgs2 and Vgs4 exceed the threshold levels Vth(31) and Vth(40), respectively.

In the low-voltage output circuit shown in FIG. 3, the bias voltage of the transistor 31 while turned off can be adjusted as close as possible to the maximum [Vth(31)] as shown by the expression (1). This is different from the conventional circuit of FIG. 1.

Further, the bias voltage of the transistor 31 is supplied by the transistor 30 that is the PMOS transistor the same as the transistor 40. It is easy to satisfy the expression (1) because the transistors 30, 31, and 40 are the same PMOS transistors. The situation where the bias voltage of the transistor 31 exceeds Vth(31) occurs mostly due to variation of the threshold level that depends on device production.

This variation depends on layout of the devices on a semiconductor wafer and can be restricted under several millivolts. This variation can be limited within several 10 mV that is the voltage rise due to connection of the substrate of the transistor 31 to the cathode of SBD 53.

This circuit is advantageous on temperature characteristics because the main components of FIG. 3 are the same PMOS transistors. This circuit thus has a wider margin on process control and temperature characteristics than the conventional circuit of FIG. 1.

Figure 1:
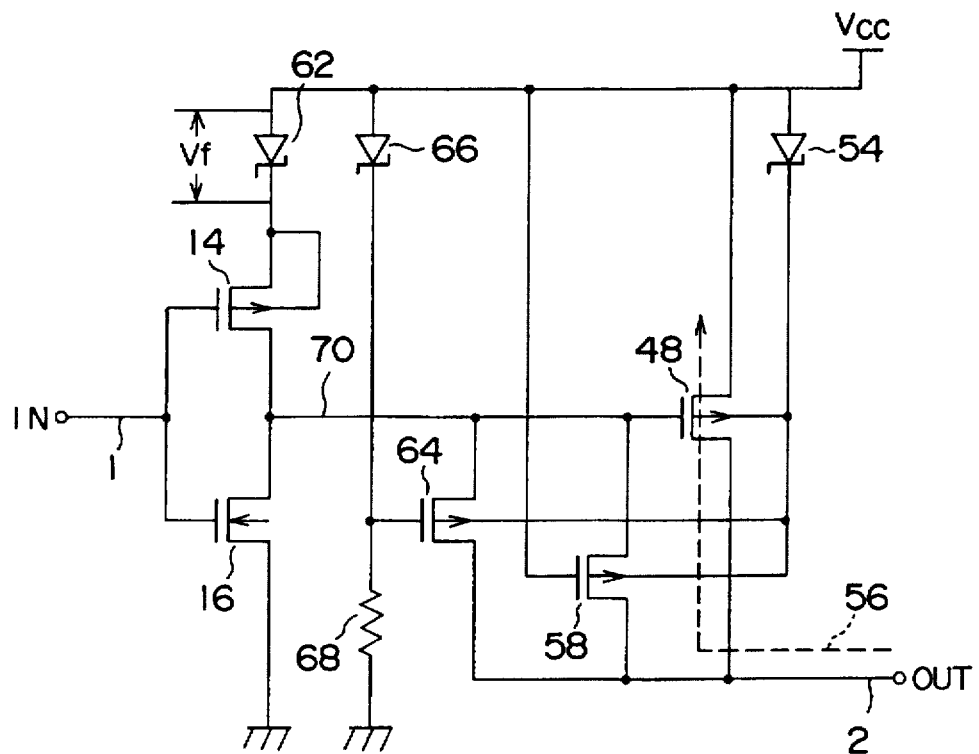
FIG. 1 is a circuit diagram of a conventional low-voltage output circuit.
Figure 2:
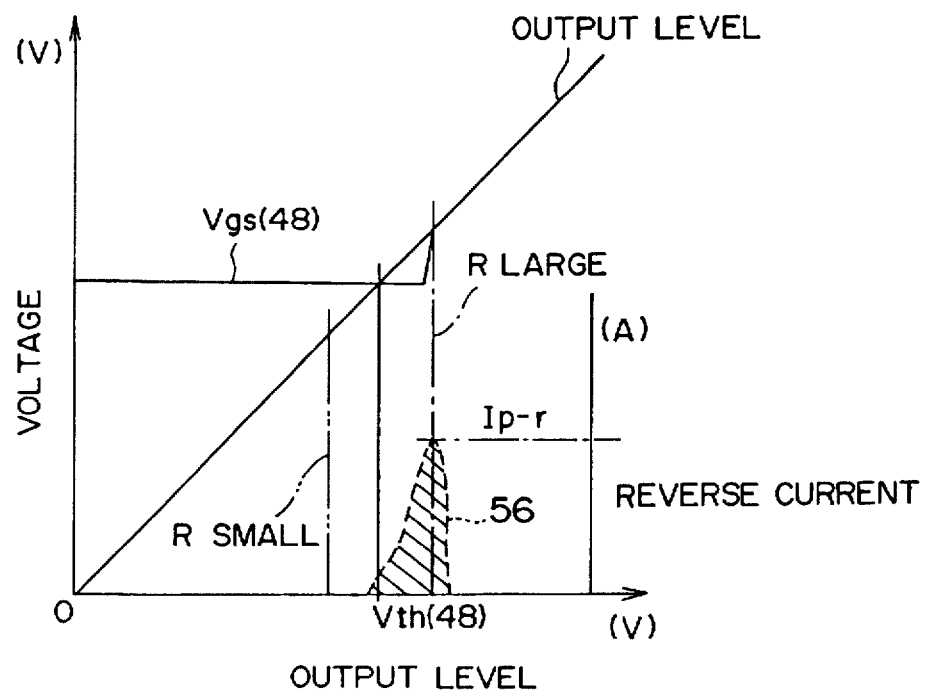
FIG. 2 is a graph representing the output characteristics of the circuit shown in FIG. 1.

Further, this circuit does not require a resistor, such as the resistor 68 of FIG. 1. Thus, this circuit consumes few d.c. currents and does not require a large area on a semiconductor wafer.

As the second preferred embodiment, the substrate of the transistor 30 can be connected to the cathode of SBD 53 as shown by a dot line 82 in FIG. 3, instead of being connected to the power supply Vcc. In this case, all the substrates of the transistors 10, 30, 31, and 40 are connected to the cathode of SBD 53. The substrate voltages are all lower than the source voltages. Further, their threshold levels are lower than usual levels. The second embodiment thus further easily satisfy the expression (1).

Figure 5:
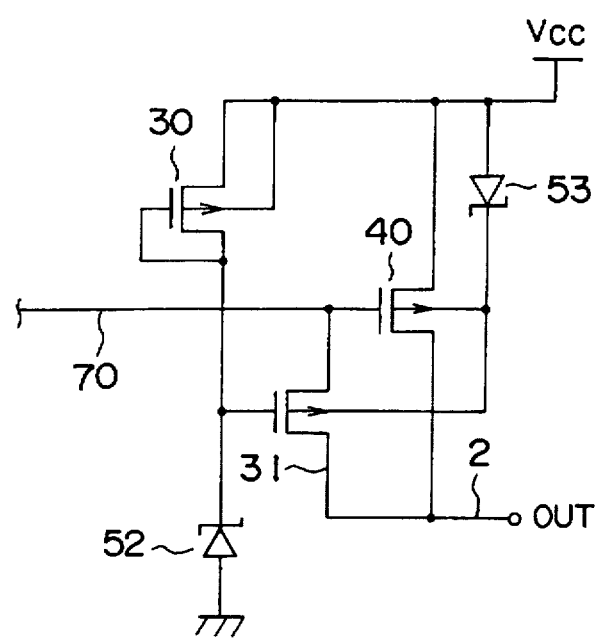
FIG. 5 is a circuit diagram of the third preferred embodiment of the low-voltage output circuit according to the present invention.

The third preferred embodiment will be explained with reference to FIG. 5. FIG. 5 shows only the main portion of the circuit. The other portion (not shown) is the same as FIG. 3. The circuit is provided with a diode SBD 52 whose anode is grounded and cathode is connected to the drain and gate of the transistors 30 and 31, respectively. The gate—source voltage of the transistor 30 is zero, however, since the supply voltage Vcc is supplied, a leak current flows through the transistor 30. The diode SBD 52 controls the leak current flow to provide an accurate basis voltage to the gate of the transistor 31. This basis voltage depends on the size of the transistor 30.

FIG. 6 shows the fourth preferred embodiment. This circuit is provided with an NMOS transistor 55 instead of SBD 52 of FIG. 5. The gate and source of the transistor 55 are short-circuited and its drain is connected to the drain of the transistor 30. The transistor 55 acts the same as SBD 52 of FIG. 5.

FIG. 7 shows the fifth preferred embodiment. This circuit is provided with a tri-state inverter 83, an output pull-up circuit 84, and an output pull-down transistor 85. The circuit shown in FIG. 3 is used as the circuit 84.

Figure 8:
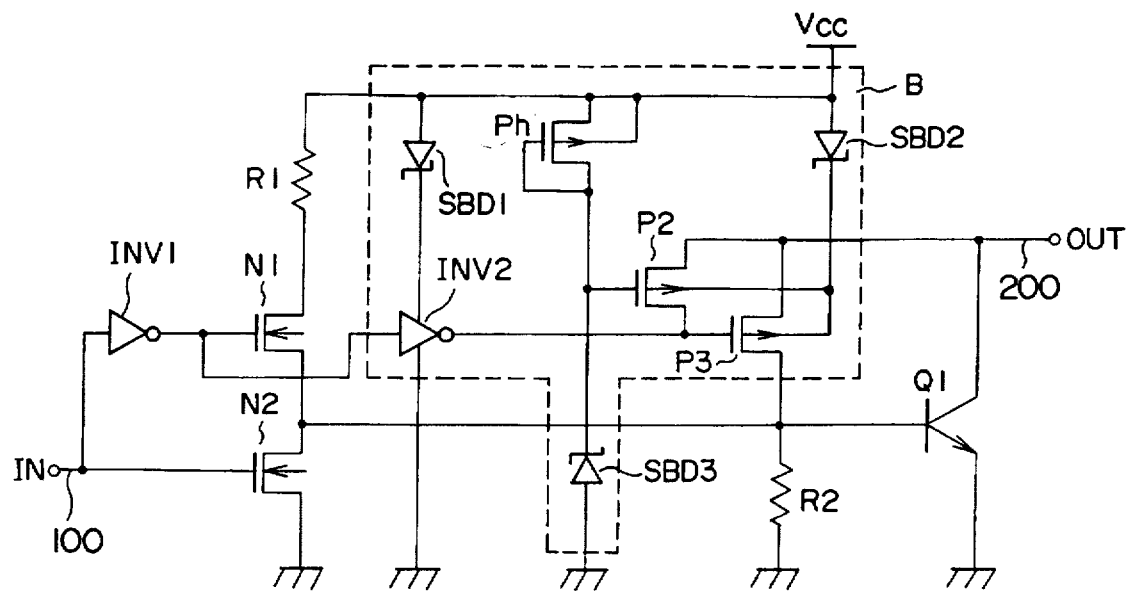
FIG. 8 is a circuit diagram of the sixth preferred embodiment of the low-voltage output circuit according to the present invention.

The sixth preferred embodiment will be described with reference to FIG. 8. FIG. 8 shows an open corrector—sink driver. The main components of FIG. 3 are used in the region depicted by dot line B.

A logic signal of "1" or "0" is fed to the circuit via input terminal 100. And the circuit generates an output logic signal at the output terminal 200. Inverters INV1 and INV2 are CMOS logic circuits. The Inverter INV2 corresponds to the inverter of PMOS transistor 10 and NMOS transistor 20 of FIG. 3.

An NPN bipolar transistor Q1 is an output sink driver. An NMOS transistor N1 is a switching device to provide a drive current IccL to the transistor Q1. An NMOS transistor N2 is provided so that the base voltage of the transistor Q1 sinks via transistor N2. Diodes SBD1 and SBD2 correspond to SBD 53 of FIG. 3. A diode SBD 3 corresponds to SBD 52 of FIG. 5.

PMOS transistors P1 and P2 correspond to the transistors 30 and 31 of FIG. 3, respectively. PMOS transistor P3 is a bypass switching transistor for a base current that would flow excessively into the transistor Q1 via output terminal 200. Further, resistors R1 and R2 are provided. The resistor R2 constantly produces the current IccL.

The circuit of FIG. 3 assures the operation of the transistor 40. While, the circuit of FIG. 8 assures the operation of the transistor P3. The substrate of the transistor P3 can be connected to the output terminal 200.

In the circuit of FIG. 8, a logic signal "1" is fed to the circuit via input terminal 100 to turn on the transistor N2 and turn off the transistors N1 and P3. The base of the transistor Q1 is thus grounded. And hence the output becomes high impedance and is raised to a certain level by an external pull-up circuit (not shown) connected to the output terminal 200.

Next, a logic signal "0" is fed to the circuit via input terminal 100 to turn on the transistor N1 and turn off the transistors N2. This causes constant current flow from the power supply Vcc to the gate of the transistor Q1 via resistor R1 and transistor N1.

The transistor Q1 thus turns on so that the output voltage sinks via transistor Q1. The transistor P3 also turns on to supply a base current to the transistor Q1 via output terminal 200 and transistor P3. When a heavy load is applied to the output, the transistor P3 acts to enhance operationability of the transistor Q1.

Next, explanation will be made why the low-voltage output circuit of present invention is advantageous over the conventional circuit with reference to FIG. 8.

Figure 9:
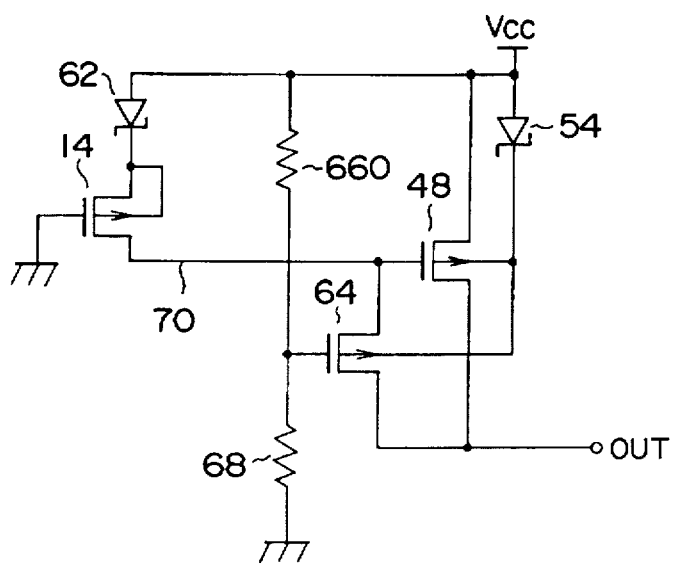
FIG. 9 is a circuit diagram of the main portion of the conventional circuit of FIG. 1 for explanation of the advantages of the present invention.

The circuit of FIG. 9 corresponds to that of FIG. 1, however, is provided with a resistor 660 instead of SBD 66 of FIG. 1.

Analysis is made under the following condition: the supply voltage Vcc is 3 V, the threshold level $|Vth|(48)$ of the transistor 48 is 0.8 V when the its substrate is connected to the cathode of SBD 54 and the current of 1 µA flows therethrough, and the voltage drop Vf(62) across SBD 62 is 0.2 V.

In this case, the voltage appearing on node 70 is 2.8 V ($=Vcc-Vf(62)=3-0.8$). The condition for the transistor 48 that remains turned off is expressed as $|Vth|(48) > Vcc - Vf(62)$.

The gate bias voltage Vgs(48) of the transistor 48 is 0.2 V ($=3-2.8$). The transistor 48 turns off because $|Vth|(48) = 0.8 > Vgs(=0.2)$. When the output voltage exceeds the supply voltage Vcc and becomes 3.6 V or more, this causes reverse current flow because, this time, $Vgs(48) > |Vth|(48)$.

The condition for the transistor 64 for short-circuiting the output, as a switching and reverse current restriction device is as follows:

$$[Vcc-Vf(62)]-[R68/R66+R68]\times Vcc < |Vth|(48) < Vcc-Vf(62) + |Vth|(48),$$

where R66 and R68 denote the resistance of the resistor 66 and 68, respectively.

The transistor 64 for short-circuiting the output, must turn on before the transistor 48. For this reason, the gate bias voltage of the transistor 64 when it is turned off must be higher than that of the transistor 48 when it is also turned off.

As described above, the transistor 48 is turned off when its gate bias voltage Vgs=0.2 V. The gate bias voltage Vgs(64) of the transistor 64 when it is turned off is in the range of 0.2 to 0.8 V because $0.2 V < |Vth|(64)$. When Vgs(64) is nearly 0.2 V, the transistor 48 tends to turn on.

On the other hand, when Vgs(64) is nearly 0.8 V, the transistor 64 turns on when the transistor 48 must be turned off. This results in the voltage on the node 70 being not raised. And this causes an erroneous operation in which the transistor 48 remains turned on when it should be turned off.

In this example, the gate bias voltage of the transistor 64 when it is turned off is in the range of 0.2 to 0.8 V. The middle value is 0.5 V and margin is ±0.3 V. This is very unstable for the low-output voltage circuit under the consideration of variation of device characteristics such as temperature characteristics.

The present invention overcomes such unstable situation by provision of a pair of the transistors 30 and 31 as shown in FIG. 3. The present invention provides the gate bias voltage of the transistor 31 when it is turned off as close as possible to 0.8 V in the range of 0.2 to 0.8 V in the example above. The margin is −0.6 V not ±0.3 V. Margin in one direction may be taken care of. And this provides flexibility for designing the low-voltage output circuit.

Figure 10:
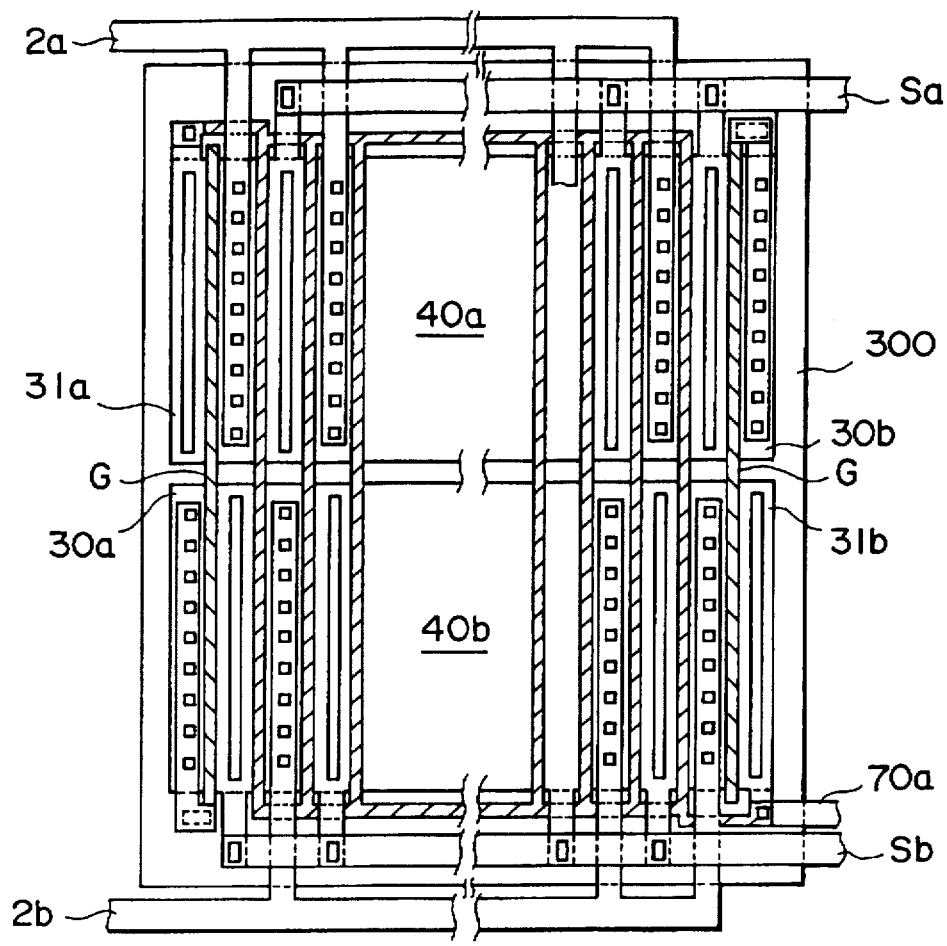
FIG. 10 is a view for illustrating a pattern layout for the main portion of the circuit shown in FIG. 3.
Figure 11:
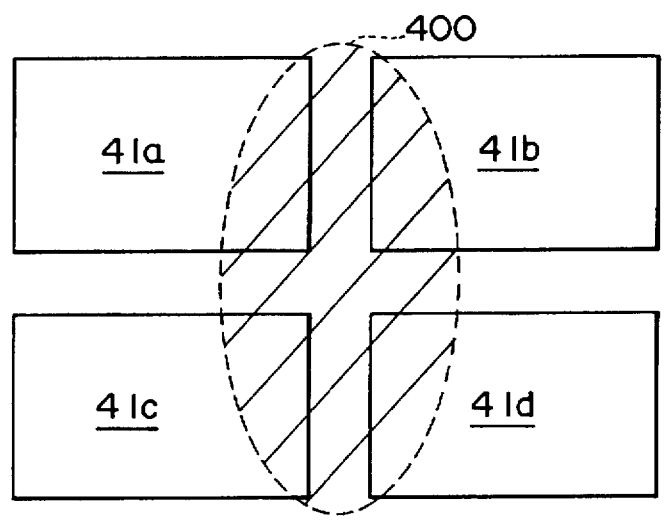
FIG. 11 is a view for schematically illustrating another pattern layout for the main portion of the circuit shown in FIG. 3.

FIG. 10 shows a pattern layout of the pair transistors 30 and 31, and also the transistor 40 shown in FIG. 3. Each transistor is formed on a semiconductor wafer 300 in two regions. Upper and lower regions 40a and 40b are for the transistor 40. Left upper and right lower regions 31a and 31b are for the transistor 31. Further, left lower and right upper regions 30a and 30b are for the transistor 30. Two patterns G that run at left and right sides are connected to the gates of the transistors 30 and 31. A pattern Sa is connected to the source of the transistor 30. A pattern Sb is connected to the source of the transistor 31 and to a pattern 70a that is the node 70 shown in FIG. 3. Further, upper and lower patterns 2a and 2b are connected to the output terminal 2 of FIG. 3.

As shown, the pair transistors 30 and 31 are formed close to each other in the same size and symmetrically in upper and lower, and left and right regions in a way that each transistor is formed in two separated regions.

This offers higher integration and less device variation that would occur in production. And hence, this layout offers precise bias voltage control of the transistor 31 while turned off to satisfy the expression (1).

FIG. 10 schematically illustrates another pattern layout of the pair transistors 30 and 31, and also the transistor 40 shown in FIG. 3. Regions 41a to 41d are for the transistor 40. A region 400 is for the transistors 30 and 31. This also offers less device variation that would occur in production.

In the embodiments above, PMOS transistors are used for the transistors 10, 30, 31, and 40, and NMOS transistors for the transistors 20 and 55. However, NMOS transistors may be used for the former transistors, and PMOS transistors for the latter transistors.

As described above, according to the present invention, before the first transistor (40) sinks, the gate voltage of the first transistor is surely cramped at the output voltage.

The second transistor (31) functions so as to cramp the gate voltage of the first transistor (40) so that the output current does not sink via first transistor (40) when the output voltage becomes grater than the gate voltage of the second transistor (31) and exceeds its threshold level.

The second transistor (31) cramps the output voltage before the first transistor (40) sinks because the gate of the second transistor (31) is connected to the power supply Vcc via third transistor (30).

There is thus provided low-voltage output circuit that connects a semiconductor device with low voltage supply, via interface, to other devices including a device driven by a high supply voltage, such as 5 volts.

Further, according to the present invention, the bias voltage of the second transistor (31) while turned off can be adjusted as close as possible to the maximum [the threshold level Vth(31)] as shown by the expression (1). Further, the bias voltage of the second transistor (31) is supplied by the third transistor (30) whose conductive type is the same as the first transistor (40).

It is easy to satisfy the expression (1) because the first, second, and third transistors (30, 31, and 40) are the same conductive—type transistors. The situation where the bias voltage of the second transistor (31) exceeds Vth(31) occurs mostly due to variation of the threshold level that depends on device production.

This variation depends on layout of the devices on a semiconductor wafer and can be restricted under several millivolts. This variation can be limited within several 10 mV that is the voltage rise due to connection of the substrate of the second transistor (31) to the cathode of a diode (SBD 53) connected to the power supply.

This circuit is advantageous on temperature characteristics because the main circuit components the same conductive—type transistors. This circuit thus has a wider margin on process control and temperature characteristics. Further, this circuit does not require a resistor used in the conventional circuit. Thus, this circuit consumes few d.c. currents and does not require a large area on a semiconductor wafer.

What is claimed is:

1. A low-voltage output circuit, comprising:

a first metal-oxide-semiconductor (MOS) transistor having a gate supplied with an input signal, and a source and a drain, either of the source and drain being supplied with a predetermined potential, the other being connected to an output terminal and generating an output signal, the first transistor raising the output signal to the predetermined potential level in response to the input signal;

a second MOS transistor having a source and a drain, either of the source and drain being connected to the gate of the first transistor, the other being connected to the output terminal;

means for supplying a bias voltage to a gate of the second transistor so that the first and second transistors remain turned off at different gate bias potentials and the second transistor turns on before the first transistor when the output terminal is supplied with a potential equal to the predetermined potential or more from outside to keep the first transistor remaining turned off; and means for restricting current flow from the output terminal to the source or the drain of the first MOS transistor supplied with the predetermined potential through the first and second transistors;

wherein the supplying means includes a third MOS transistor having a gate, a source, and a drain, either of the source and drain being supplied with the predetermined potential, the other connected to the gates of the second and third transistors, the third transistor supplying the bias voltage to the gate of the second transistor so that the bias voltage corresponds to a difference between the predetermined potential and a threshold level of the third transistor; and wherein the supplying means further includes a Schottky barrier diode having an anode and a cathode, either of the anode and cathode being connected to the gate of the second transistor, the other being supplied with a reference potential.

2. The circuit according to claim 1, wherein the second and third transistors are formed in the same size and layout, and close to each other on a semiconductor substrate.

3. A low-voltage output circuit, comprising:

a first metal-oxide-semiconductor (MOS) transistor having a gate supplied with an input signal, and a source and a drain, either of the source and drain being supplied with a predetermined potential, the other being connected to an output terminal and generating an output signal, the first transistor raising the output signal to the predetermined potential level in response to the input signal;

a second MOS transistor having a source and a drain, either of the source and drain being connected to the gate of the first transistor, the other being connected to the output terminal;

means for supplying a bias voltage to a gate of the second transistor so that the first and second transistors remain turned off at different gate bias potentials and the second transistor turns on before the first transistor when the output terminal is supplied with a potential equal to the predetermined potential or more from outside to keep the first transistor remaining turned off; and means for restricting current flow from the output terminal to the source or the drain of the first MOS transistor supplied with the predetermined potential through the first and second transistors;

wherein the supplying means include a third MOS transistor having a gate, a source, and a drain, either of the source and drain being supplied with the predetermined potential, the other connected to the gates of the second and third transistors, the third transistor supplying the bias voltage to the gate of the second transistor so that the bias voltage corresponds to a difference between the predetermined potential and a threshold level of the third transistor; and wherein the supplying means further includes a fourth MOS transistor, a conductive type of the fourth transistor being opposite to types of the first, second, and third transistors, the fourth MOS transistor having a source and a drain, either of the source and drain being connected to the gate of the second transistor, the other being connected to a gate of the fourth transistor and being supplied with a reference potential.

4. The circuit according to claim 3, wherein the restricting means includes a Schottky barrier diode having an anode and a cathode, either of the anode and cathode being supplied with the predetermined potential, the other being connected to substrates of the first and second transistors.

* * * * *